United States Patent
Choi et al.

(10) Patent No.: US 10,861,569 B1
(45) Date of Patent: Dec. 8, 2020

(54) MEMORY DEVICE AND METHOD OF OPERATING THE MEMORY DEVICE

(71) Applicant: SK hynix Inc., Icheon-si (KR)

(72) Inventors: Won Jae Choi, Icheon-si (KR); Sung Bak Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/733,698

(22) Filed: Jan. 3, 2020

(30) Foreign Application Priority Data

May 27, 2019 (KR) .......................... 10-2019-0061884

(51) Int. Cl.
| | |
|---|---|
| *G11C 16/34* | (2006.01) |
| *G11C 16/04* | (2006.01) |
| *G11C 16/10* | (2006.01) |
| *G11C 16/26* | (2006.01) |
| *G11C 11/56* | (2006.01) |

(52) U.S. Cl.
CPC ...... *G11C 16/3431* (2013.01); *G11C 16/0483* (2013.01); *G11C 16/10* (2013.01); *G11C 16/26* (2013.01); *G11C 16/3459* (2013.01); *G11C 11/5628* (2013.01); *G11C 11/5671* (2013.01)

(58) Field of Classification Search
CPC .................................................... G11C 16/349
USPC ..................................................... 365/185.25
See application file for complete search history.

(56) References Cited

U.S. PATENT DOCUMENTS

| | | |
|---|---|---|
| 9,269,451 B2 | 2/2016 | Ellis |
| 9,595,342 B2 | 3/2017 | Pang et al. |
| 2015/0242143 A1* | 8/2015 | Kim ..................... G11C 16/349 |
| | | 714/704 |

FOREIGN PATENT DOCUMENTS

KR     1020140050145 A     4/2014

OTHER PUBLICATIONS

Yu Cai et al., "Flash Correct-and-Refresh: Retention-Aware Error Management for Increased Flash Memory Lifetime", pp. 1-8, IEEE, 2012.

* cited by examiner

*Primary Examiner* — Jason Lappas
(74) *Attorney, Agent, or Firm* — William Park & Associates Ltd.

(57) ABSTRACT

Provided herein may be a memory device and a method of operating the memory device. The memory device may include memory cells configured to store data, a peripheral circuit configured to perform program and read operation on memory cells selected from among the memory cells, and a refresh controller configured to include a counter and a refresh manager, wherein the counter is configured to count a number of memory cells which are in an erased state or a programmed state by performing a read operation on the selected memory cells using a reference read voltage, and the refresh manager is configured to compare a read count indicating the counted number of memory cells, with a preset reference count, to determine whether to shift the reference read voltage and to control the peripheral circuit so that the program operation is performed using a voltage different than a program voltage by a step voltage.

20 Claims, 22 Drawing Sheets

FIG. 10

| REFERENCE COUNT (REF_COUNT) | READ COUNT (READ_COUNT) | \| REFERENCE COUNT − READ COUNT \| |
|---|---|---|
| REF_COUNT3 | READ_COUNT1 | \| REF_COUNT3 − READ_COUNT1 \| |
| REF_COUNT3 | READ_COUNT2 | \| REF_COUNT3 − READ_COUNT2 \| |
| REF_COUNT3 | READ_COUNT3 | \| REF_COUNT3 − READ_COUNT3 \| |
| REF_COUNT3 | READ_COUNT4 | \| REF_COUNT3 − READ_COUNT4 \| |

FIG. 11

| PROGRAMMED STATE (P) | REFERENCE READ VOLTAGE (R) | SHIFTED READ VOLTAGE (SHIFT_RV) | | |
|---|---|---|---|---|
| P1 | R1 | R1' | R1" | R1'" |
| P2 | R2 | R2' | R2" | R2'" |
| P3 | R3 | R3' | R3" | R3'" |

FIG. 13

| SHIFTING COUNT (SHIFTING_COUNT) | STEP VOLTAGE (Vstep) |
|---|---|
| 1 | Vstep1 |
| 2 | Vstep2 |
| 3 | Vstep3 |
| 4 | Vstep4 |

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2019-0061884 filed on May 27, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

A storage device is a device which stores data under the control of a host device such as a computer, a smartphone, or a smartpad. Examples of the storage device include a device such as a hard disk drive (HDD) which stores data in a magnetic disk, and a device such as a solid state drive (SSD) or a memory card which stores data in a semiconductor memory, particularly, a nonvolatile memory, according to the device in which data is stored.

The storage device may include a memory device in which data is stored and a memory controller which controls the storage of data in the memory device. Such memory devices may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

An embodiment of the present disclosure may provide for a memory device. The memory device may include a plurality of memory cells configured to store data, a peripheral circuit configured to perform a program operation and a read operation on memory cells selected from among the plurality of memory cells, and a refresh controller configured to include a counter and a refresh manager, wherein the counter is configured to count a number of memory cells which are in an erased state or a programmed state by performing a read operation on the selected memory cells using a reference read voltage determined depending on a programmed state of the selected memory cells, and the refresh manager is configured to compare a read count indicating the counted number of memory cells, with a preset reference count, to determine whether to shift the reference read voltage based on a result of the comparison, and to control the peripheral circuit so that the program operation is performed using a voltage higher than a program voltage used to program the selected memory cells by a step voltage that is set based on a shifting count indicating a number of times that the reference read voltage is shifted.

An embodiment of the present disclosure may provide for a method of operating a memory device including a plurality of memory cells in which data is stored. The method may include performing a read operation on memory cells, selected from among the plurality of memory cells, using a reference read voltage determined depending on a programmed state of the selected memory cells, counting a number of memory cells that are turned on through the read operation to obtain a read count, determining whether to shift the reference read voltage by comparing the read count with a preset reference count, setting a step voltage based on a shifting count indicating a number of times that the reference read voltage is shifted, and performing a program operation using a voltage higher than a program voltage used to program the selected memory cells by the step voltage.

BRIEF DESCRIPTION OF THE DRAWINGS

FIG. 10 is a diagram for explaining a reference count and a read count.

FIG. 11 is a diagram for explaining reference read voltages and shifted read voltages depending on programmed states.

FIG. 13 is a diagram for explaining step voltages that are set according to the shifting count.

DETAILED DESCRIPTION

Figure 1:
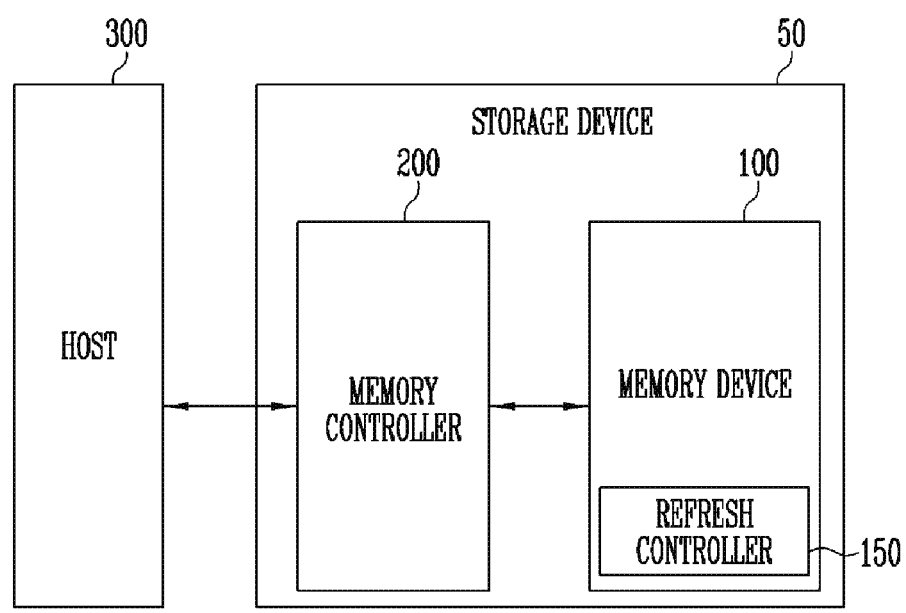
FIG. 1 is a block diagram illustrating a storage device.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

Various embodiments of the present disclosure may be directed to a memory device, which refreshes data without outputting the data to a memory controller, and a method of operating the memory device.

FIG. 1 is a block diagram illustrating a storage device.

Referring to FIG. 1, a storage device 50 may include a memory device 100, a memory controller 200, and a buffer memory (not illustrated).

The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

The memory device 100 may include a refresh controller 150. The refresh controller 150 may control a refresh operation on data stored in the memory device 100. In an embodiment, the refresh controller 150 may control the memory device 100 so that the data stored in the memory device 100 is refreshed without being output to the memory controller 200.

For example, as time elapses since the programming of the memory cells, retention characteristics may be degraded due to causes, such as leakage or interference, and thus the threshold voltage distributions of the memory cells may change. When the threshold voltage distributions change, error data may increase, and thus the data stored in the memory cells may become invalid data. Therefore, in the present embodiment, a refresh operation of recovering the data stored in the memory device 100 may be performed.

The refresh operation according to the present embodiment may be performed by applying a program voltage to a selected word line. Here, the program voltage may be a voltage higher than an existing program voltage by a step voltage. The data stored in the memory device 100 may be refreshed by applying the program voltage to the selected word line.

The memory controller 200 may control the overall operation of the storage device 50.

When power is applied to the storage device 50, the memory controller 200 may run firmware (FW). When the memory device 100 is a flash memory device 100, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory.

The memory controller 200 may control the memory device 100 so that a program operation, a read operation or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control data exchange between the host 300 and the buffer memory (not illustrated). Alternatively, the memory controller 200 may temporarily store system data for controlling the memory device 100 in the buffer memory (not illustrated). For example, the memory controller 200 may temporarily store data, input from the host 300, in the buffer memory, and may then transmit the data, temporarily stored in the buffer memory, to the memory device 100.

In various embodiments, the buffer memory may be used as a working memory or a cache memory for the memory controller 200. The buffer memory may store codes or commands that are executed by the memory controller 200. Alternatively, the buffer memory may store data that is processed by the memory controller 200.

In an embodiment, the buffer memory may be implemented as a DRAM such as a double data rate SDRAM (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the storage device 50 might not include the buffer memory. In this case, volatile memory devices 100 disposed outside the storage device 50 may function as the buffer memory.

In an embodiment, the memory controller 200 may control at least two memory devices 100. In this case, the memory controller 200 may control the memory devices 100 depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
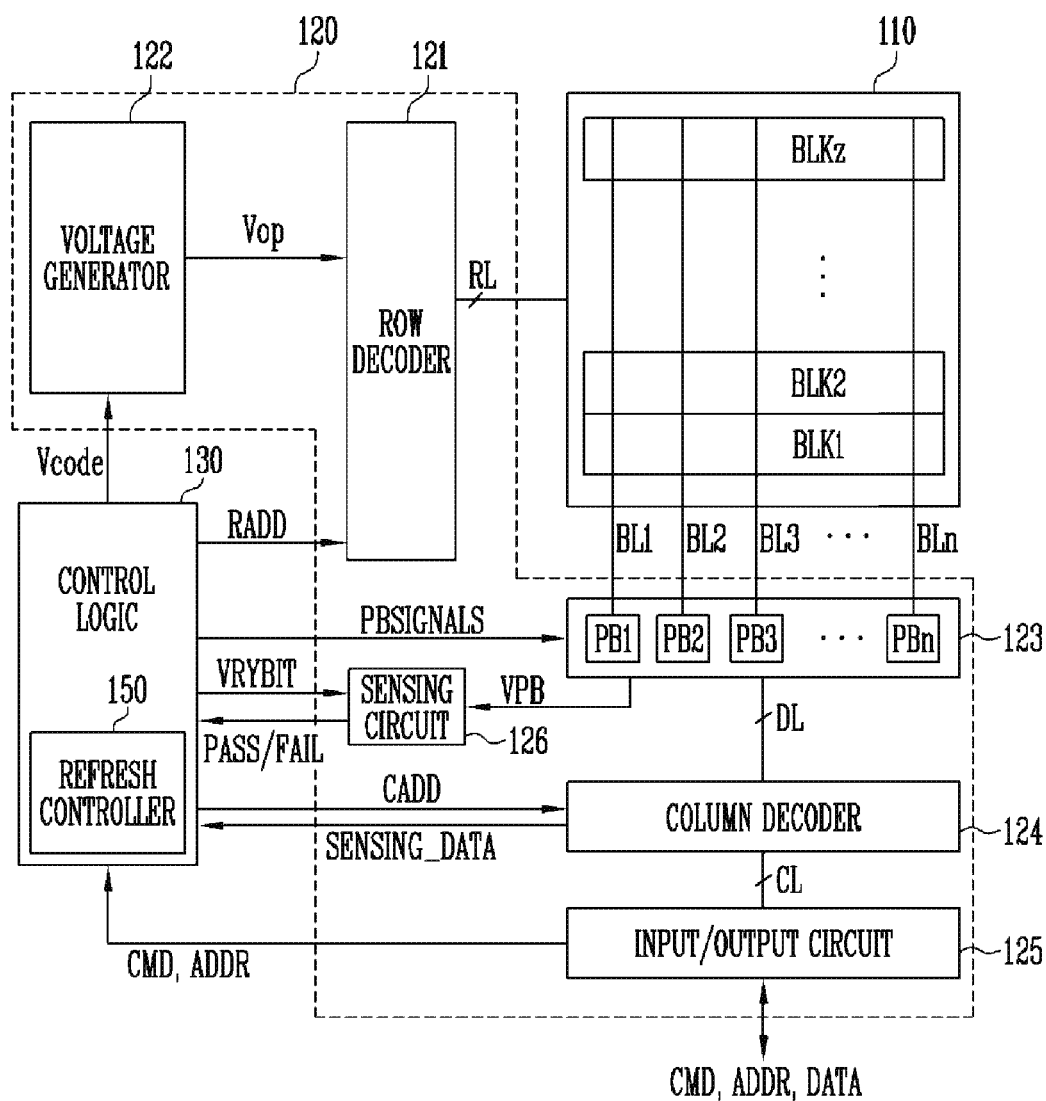
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, and an input/output circuit 125.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. For example, the voltage generator 122 may generate various operating voltages Vop that are used for program, read, and erase operations in response to an operation signal. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to n-th page buffers PB1 to PBn. The first to n-th page buffers PB1 to PBn are coupled to the memory cell array 110 through the first to n-th bit lines BL1 to BLn. The first to n-th page buffers PB1 to PBn are operated under the control of the control logic 130. For example, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn or may sense voltages or currents of the bit lines BL1 to BLn during a read or verify operation.

For example, during a program operation, when the program voltage is applied to the selected word line, the first to n-th page buffers PB1 to PBn may transfer the data DATA, received through the input/output circuit 125, to selected memory cells through the first to n-th bit lines BL1 to BLn. The memory cells in the selected page are programmed based on the received data DATA. During a program verify operation, the first to n-th page buffers PB1 to PBn may read page data by sensing the voltages or currents received through the first to n-th bit lines BL1 to BLn from the selected memory cells.

During a read operation, the first to n-th page buffers PB1 to PBn may read data DATA from the memory cells in the selected page through the first to n-th bit lines BL1 to BLn, and may output the read data DATA to the input/output circuit 125 under the control of the column decoder 124.

During the erase operation, the first to n-th page buffers PB1 to PBn may allow the first to n-th bit lines BL1 to BLn to float or may apply the erase voltage to the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and an address ADDR, received from the memory controller 200 described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal, the row address RADD, the page buffer control signals PBSIGNALS, and the enable bit VRYBIT in response to the command CMD and the address ADDR. In addition, the control logic 130 may determine whether a verify operation has passed or failed in response to the pass or fail signal PASS or FAIL.

The memory cells included in the memory cell array 110 may be programmed to any one of a plurality of programmed states depending on the data stored in each memory cell. A target programmed state of the corresponding memory cell may be determined to be any one of the plurality of programmed states depending on the data to be stored.

In an embodiment of the present disclosure, the control logic 130 may include a refresh controller 150. The refresh controller 150 may be enabled and operated in a refresh mode when a refresh command CMD is received from the memory controller 200 or when it is determined that a refresh operation is required based on a reference value set in the control logic 130.

In the refresh mode, the memory device 100 may perform a read operation. The read operation performed by the memory device 100 may be an operation of distinguishing different programmed states from each other or an operation of distinguishing an erased state E from the corresponding programmed state.

During a read operation, in order to generate a read voltage required for the read operation, the refresh controller 150 may generate a voltage code Vcode corresponding to the level of the read voltage and provide the voltage code Vcode to the voltage generator 122. The voltage generator 122 may generate a read voltage based on the voltage code Vcode. The memory device 100 may perform a read operation based on the generated read voltage.

The sensing data SENSE_DATA, which is detected during the read operation, may be provided to the refresh controller 150 through the page buffer group 123 and the column decoder 124. The refresh controller 150 may determine whether to re-perform the read operation based on the number of 1s contained in the sensing data SENSE_DATA.

When it is determined that the read operation is to be re-performed, the refresh controller 150 may generate a new voltage code Vcode and provide the new voltage code Vcode to the voltage generator 122 to generate a new read voltage. Here, the voltage code Vcode may be a shifted read voltage SHIFT_RV, which is different from the read voltage generated in the previous read operation. Based on the result of performing the read operation using the shifted read voltage SHIFT_RV, the refresh controller 150 may additionally determine whether to re-perform a read operation.

When it is determined that a read operation is not to be re-performed, the refresh controller 150 may generate a voltage code Vcode and provide the voltage code Vcode to the voltage generator 122 to generate a program voltage required for the refresh operation. Here, the program voltage may be a voltage higher than a reference program voltage by a step voltage. The step voltage may be set depending on the number of times that the read voltage is shifted, that is, SHIFTING_COUNT.

Figure 3:
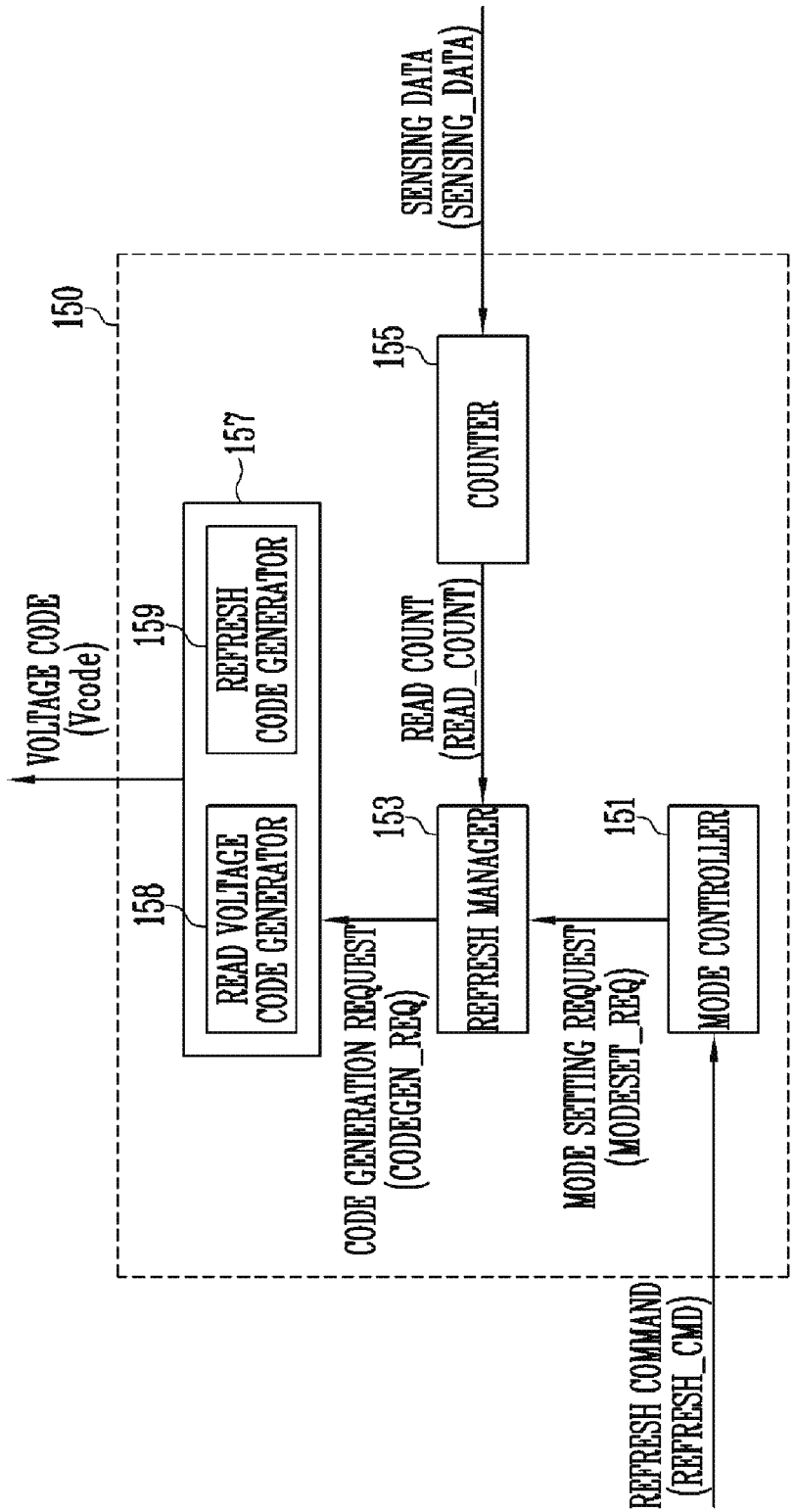
FIG. 3 is a block diagram illustrating the structure of a refresh controller of FIG. 2.

FIG. 3 is a block diagram illustrating the structure of the refresh controller of FIG. 2.

Referring to FIG. 3, the refresh controller 150 may include a mode controller 151, a refresh manager 153, a counter 155, and a code generator 157.

The mode controller 151 may control the mode of a memory device 100. The mode of the memory device 100 may be a refresh mode or a normal mode. The refresh mode may be the operation mode of the memory device 100 which is set to allow the memory device 100 to perform a refresh operation. The refresh operation may be an operation of recovering the data stored in memory cells included in the memory device 100. The normal mode may be the operation mode of the memory device except the refresh mode.

In an embodiment, when a refresh command REFRESH_CMD is received from the memory controller 200, the mode controller 151 may activate the refresh mode.

When the refresh command REFRESH_CMD is received, the mode controller 151 may provide a mode setting request MODESET_REQ for allowing the memory device 100 to be operated in the refresh mode to the refresh manager 153. When a command other than the refresh command REFRESH_CMD is received, the mode controller 151 might not provide the mode setting request MODESET_REQ to the refresh manager 153.

Alternatively, when the status of the memory device 100 meets a preset specific requirement even if the refresh command REFRESH_CMD is not received, the mode controller 151 may autonomously output the mode setting request MODESET_REQ. For example, when a preset time elapses since the programming of a memory block, the mode controller 151 may autonomously output the mode setting request MODESET_REQ to refresh the corresponding memory block.

The refresh manager 153 may control the memory device 100 so that the memory device 100 performs a read operation and a program operation in response to the mode setting request MODESET_REQ.

In an embodiment, when the refresh manager 153 receives the mode setting request MODESET_REQ from the mode controller 151, the refresh manager 153 may provide the code generator 157 with a code generation request CODEGEN_REQ requesting the generation of a voltage code Vcode corresponding to the level of the read voltage. The read voltage may be a voltage for distinguishing different programmed states from each other or a voltage for distinguishing the corresponding programmed state from an erased state.

For example, when a selected memory block is managed as a single-level cell (SLC) manner, the read voltage may be the voltage for distinguishing one programmed state from one erased state. Here, the read voltage may be a reference read voltage for distinguishing the corresponding programmed state from the erased state when the memory cells have ideal threshold voltage distributions.

In an embodiment, when the selected memory block is managed in a multi-level cell (MLC) manner, the read voltage may be selected from among voltages for distinguishing a plurality of programmed states from one erased state. Here, the read voltage may be a reference read voltage for distinguishing one programmed state from an erased state or for distinguishing one programmed state from another programmed state when the memory cells have ideal threshold voltage distributions. For example, in the multi-level cell (MLC) manner, the reference read voltage may be any one of a first reference read voltage for distinguishing an erased state from a first programmed state, a second reference read voltage for distinguishing the first programmed state from a second programmed state, and a third reference read voltage for distinguishing the second programmed state from a third programmed state.

In an embodiment, when the selected memory block is managed in a triple-level cell (TLC) or quadruple-level cell (QLC) manner, the reference read voltage may be selected from among voltages for distinguishing the plurality of programmed states from one erased state.

Although the following embodiments will be described based on the multi-level cell (MLC) manner, but the present disclosure may also be applied to the single-level cell (SLC), the triple-level cell (TLC) or the quadruple-level cell (QLC) manner.

The refresh manager 153 may output the code generation request CODEGEN_REQ in response to the mode setting request MODESET_REQ. For example, the refresh manager 153 may output the code generation request CODEGEN_REQ requesting the generation of a read voltage or a program voltage for a refresh in response to the mode setting request MODESET_REQ. For example, when the memory device 100 is managed in the MLC manner, a change in the threshold voltage of a third programmed state P3 which is the highest programmed state, among a plurality of programmed states, may be the largest. Therefore, in order to check the change in the threshold voltage, the refresh manager 153 may provide the code generator 157 with a code generation request CODEGEN_REQ requesting the generation of a voltage code Vcode corresponding to the level of the third reference read voltage.

The code generator 157 may include a read voltage code generator 158 and a refresh code generator 159, and may generate the voltage code Vcode in response to the code generation request CODEGEN_REQ.

For example, the read voltage code generator 158 and the refresh code generator 159 may be selectively operated in response to the code generation request CODEGEN_REQ received from the refresh manager 153, and may then output the voltage code Vcode for generating the read voltage or the program voltage for a refresh. For example, when a code generation request CODEGEN_REQ for re-performing a read operation is received, the read voltage code generator 158 may be activated. When the code generation request CODEGEN_REQ for a refresh program operation is received, the refresh code generator 159 may be activated.

When the code generation request CODEGEN_REQ for re-performing the read operation is received, the read voltage generation code generator 158 may generate the voltage code Vcode corresponding to the read voltage level. The generated voltage code Vcode may be provided to the voltage generator 122, and the voltage generator 122 may generate a read voltage based on the voltage code Vcode. The memory device 100 may perform a read operation based on the generated read voltage. The sensing data SENSE_DATA, which is detected during the read operation, may be provided to the counter 155 through the page buffer group 123 and the column decoder 124.

The counter 155 may count the number of 1s contained in the sensing data SENSE_DATA. That is, the counter 155 may be designated to count the number of turned-on memory cells, but may be designated to count the number of 0s, that is, the number of turned-off memory cells. In the following embodiment, the counter 155 for counting the number of 1s will be described by way of example.

When the counter 155 counts the number of 1s contained in the sensing data SENSE_DATA and calculates the number of reads (i.e., read count READ_COUNT), the calculated read count READ_COUNT may be provided to the refresh manager 153. The refresh manager 153 may determine whether to re-perform the read operation based on the read count READ_COUNT.

For example, when the threshold voltage distributions of memory cells indicate ideal threshold voltage distributions, the memory device 100 may perform a read operation using the third reference read voltage. When the read operation is performed using the third reference read voltage, the number of turned-on memory cells may be the read count READ_COUNT.

The refresh manager 153 may determine whether to re-perform the read operation based on the difference between a preset reference count and the received read count READ_COUNT. The reference count may be the allowable number of memory cells, the threshold voltages of which have changed. Here, the allowable number of memory cells may be a value smaller than the number of memory cells, the threshold voltages of which have changed and in which a read error may occur. Therefore, the reference count may be set during a test operation of the memory device 100, and may also be set to different values depending on the memory device 100.

For example, when the difference between the reference count REF_COUNT and the read count READ_COUNT is greater than a specific value, the refresh manager 153 may determine to re-perform a read operation, whereas when the difference between the reference count REF_COUNT and the read count READ_COUNT is less than or equal to the specific value, the refresh manager 153 may determine not to re-perform a read operation. Here, the specific value may be set in consideration of the margin between the number of memory cells in which a read error may occur and the allowable number of memory cells.

When the refresh manager 153 determines to re-perform a read operation, the refresh manager 153 may provide the code generation request CODEGEN_REQ requesting the generation of the voltage code Vcode to the code generator

157. The code generation request CODEGEN_REQ may be a generation request for a code corresponding to the level of a read voltage SHIFT_RV shifted from a previous read voltage. The magnitude of the shifted read voltage SHIFT_RV may be determined according to the difference between the reference count REF_COUNT and the read count READ_COUNT.

When the code generation request CODEGEN_REQ corresponding to the level of the shifted read voltage SHIFT_RV is received, the read voltage code generator 158 may generate the voltage code Vcode. Thereafter, the memory device 100 may generate a read operation using the read voltage generated based on the voltage code Vcode. Also, the refresh manager 153 may determine again whether to re-perform a read operation based on the sensing data SENSE_DATA which is detected during the read operation.

When the refresh manager 153 determines not to re-perform the read operation, the refresh manager 153 may provide a code generation request CODEGEN_REQ for a refresh program operation to the refresh code generator 159. The code generation request CODEGEN_REQ may be a generation request for the voltage code Vcode corresponding to the level of the program voltage required for the refresh operation. The program voltage may be a voltage higher than the program voltage, which has been applied to a selected word line during the program operation, by a step voltage. The level of the step voltage may be set depending on the number of times that the read voltage is shifted, that is, SHIFTING_COUNT.

In an embodiment, the refresh code generator 159 may provide the voltage generator 122 with the voltage code Vcode, corresponding to the level of the program voltage required for the refresh operation. The voltage generator 122 may generate the program voltage based on the voltage code Vcode. The memory device 100 may perform a program operation using the generated program voltage. Thereafter, until all of the memory cells are programmed through a verify operation, the program voltage to be applied to a word line of a refresh target page may be increased by the step voltage.

Figure 4:
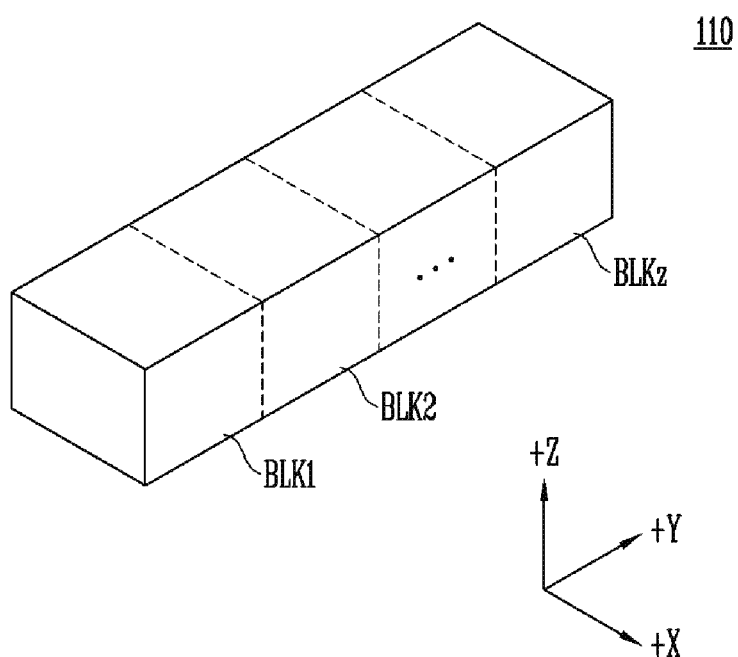
FIG. 4 is a diagram illustrating an embodiment of a memory cell array of FIG. 2.

FIG. 4 is a diagram illustrating an embodiment of the memory cell array of FIG. 2.

Referring to FIG. 4, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described below with reference to FIGS. 5 and 6.

Figure 5:
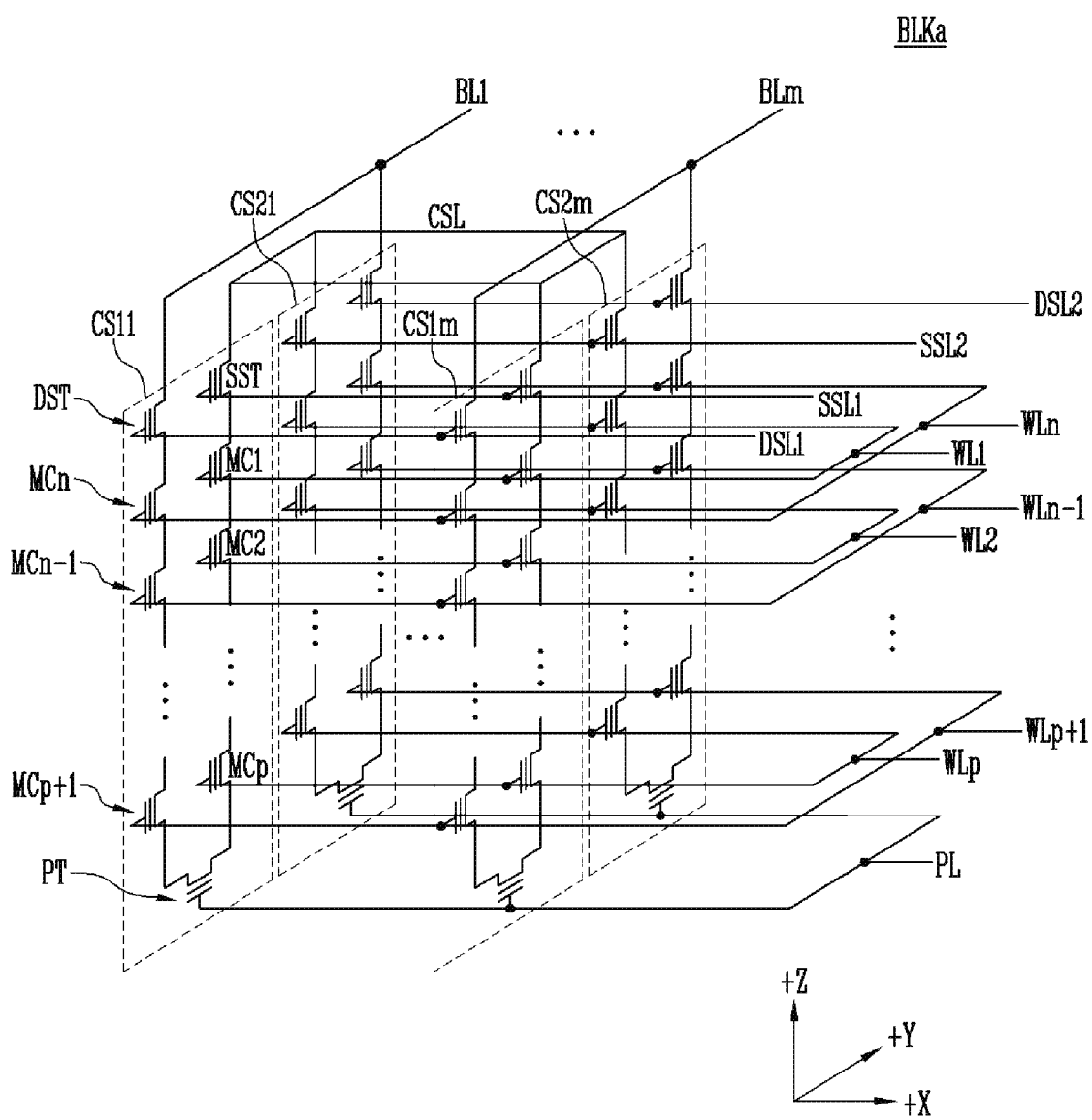
FIG. 5 is a circuit diagram illustrating any one memory block BLKa of memory blocks BLK1 to BLKz of FIG. 4.

FIG. 5 is a circuit diagram illustrating any one memory block BLKa of the memory blocks BLK1 to BLKz of FIG. 4.

Referring to FIG. 5, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 5, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 5, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extending in a column direction. In FIG. 5, cell strings CS11 and CS21 in a first column are coupled to a first bit line BL1. Cell strings CS1$m$ and CS2$m$ in an m-th column are coupled to an m-th bit line BL$m$.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BL$m$, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
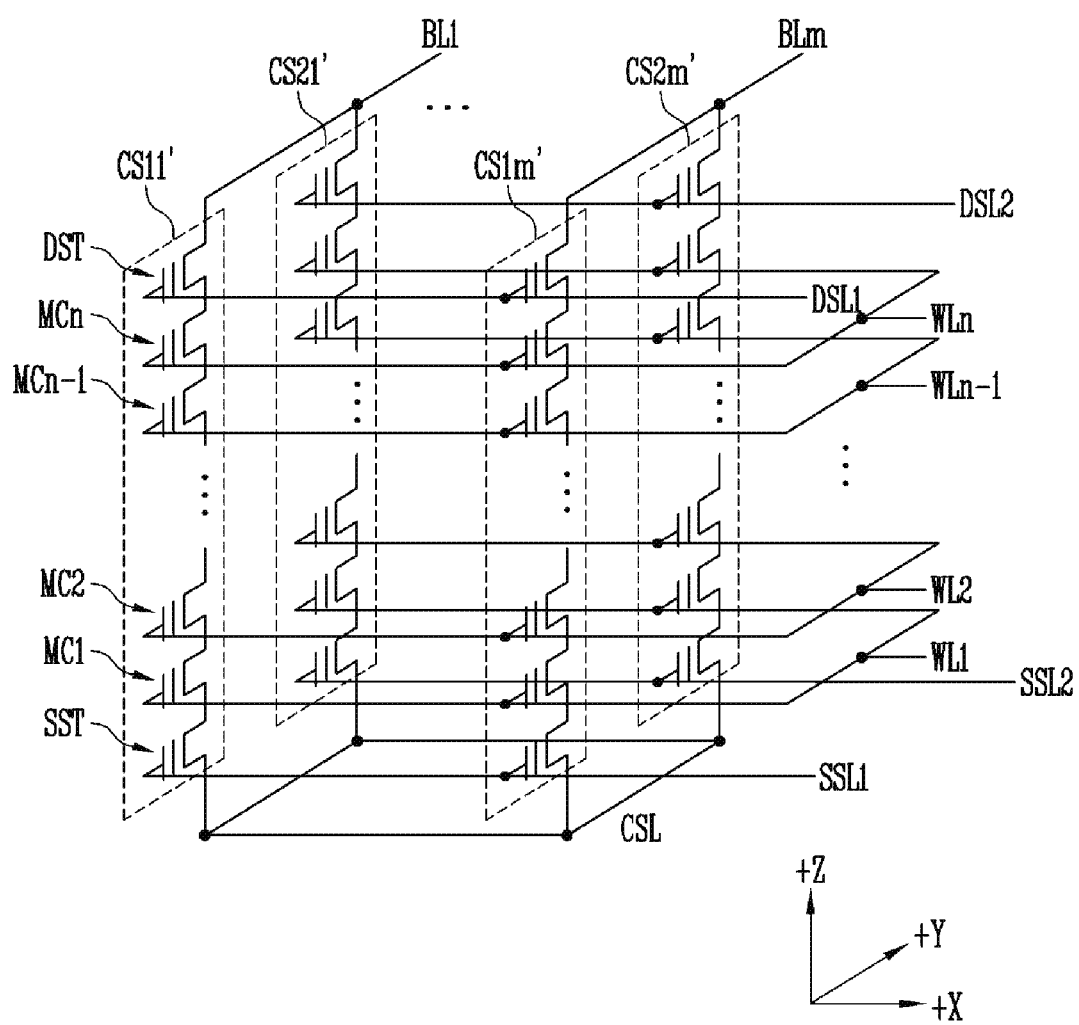
FIG. 6 is a circuit diagram illustrating an example of any one memory block BLKb of the memory blocks BLK1 to BLKz of FIG. 4.

FIG. 6 is a circuit diagram illustrating an example of any one memory block BLKb of the memory blocks BLK1 to BLKz of FIG. 4.

Referring to FIG. 6, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 6 has an equivalent circuit similar to that of the memory block BLKa of FIG. 5 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

Also, in order to reduce an electric field between the source select transistor SST and the memory cells MC1 to MCn, at least one of the first to n-th memory cells MC1 to MCn may be used as a dummy memory cell.

Figure 7:
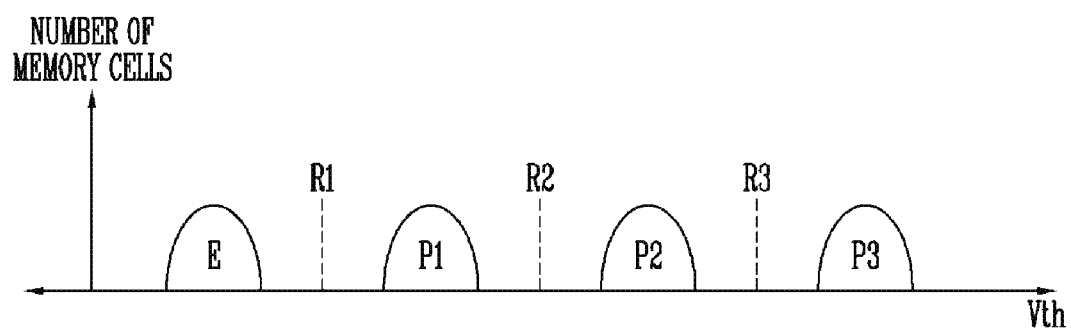
FIG. 7 is a diagram for explaining threshold voltage distributions and read voltages of multi-level cells.

FIG. 7 is a diagram for explaining threshold voltage distributions and read voltages of multi-level cells.

Referring to FIG. 7, memory cells managed in a multi-level cell (MLC) manner may have fourth threshold voltage distributions. A horizontal axis of FIG. 7 indicates the threshold voltages Vth of memory cells and a vertical axis of FIG. 7 indicates the number of memory cells. The threshold voltage distributions of FIG. 7 indicate distributions before the threshold voltages of programmed memory cells do not change.

In an embodiment, when the memory cells included in the memory device 100 are multi-level cells (MLC), the memory cells included in the memory device 100 may each have a state corresponding to any one of an erased state E, a first programmed state P1, a second programmed state P2, and a third programmed state P3. The threshold voltages Vth of the memory cells may increase in a direction from the erased state E to the third programmed state P3.

In an embodiment, a read voltage for distinguishing the erased state E from the first programmed state P1 may be a first reference read voltage R1. A read voltage for distinguishing the first programmed state P1 from the second programmed state P2 may be a second reference read voltage R2. A read voltage for distinguishing the second programmed state P2 from the third programmed state P3 may be a third reference read voltage R3.

In an embodiment, a reference read voltage may be a voltage selected from among the first to third reference read voltages R1 to R3.

For example, the first reference read voltage R1 may be the read voltage for distinguishing the erased state E from the first programmed state P1. The first reference read voltage may have a median value of the highest threshold voltage in the threshold voltage distribution of the erased state E and the lowest threshold voltage in the threshold voltage distribution of the first programmed state P1.

The second reference read voltage R2 may be the second reference read voltage for distinguishing the first programmed state P1 from the second programmed state P2. The second reference read voltage may have a median value of the highest threshold voltage in the threshold voltage distribution of the first programmed state P1 and the lowest threshold voltage in the threshold voltage distribution of the second programmed state P2.

The third reference read voltage R3 may be the third reference read voltage R3 for distinguishing the second programmed state P2 from the third programmed state P3. The third reference read voltage may have a median value of the highest threshold voltage in the threshold voltage distribution of the second programmed state P2 and the lowest threshold voltage in the threshold voltage distribution of the third programmed state P3.

Figure 8:
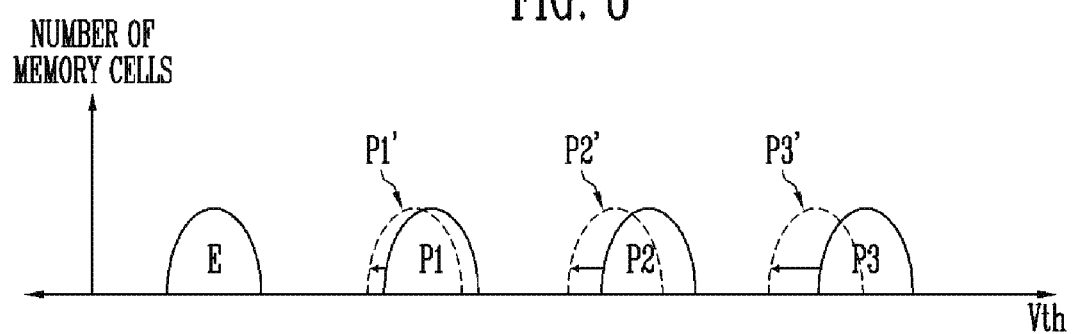
FIG. 8 is a diagram for explaining changes in threshold voltage distributions caused by the degradation of retention characteristics.

FIG. 8 is a diagram for explaining changes in threshold voltage distributions caused by the degradation of retention characteristics.

Referring to FIGS. 7 and 8, FIG. 8 illustrates threshold voltage distributions, which have changed from the threshold voltage distributions of FIG. 7 due to the retention degradation of memory cells.

Retention refers to a phenomenon in which the threshold voltage distributions of memory cells included in the memory device 100 are entirely decreased with the lapse of time since the memory cells have been programmed. That is, as time elapses since the memory cells have been programmed, the retention characteristics may be degraded, and thus the threshold voltage distributions of the memory cells may be gradually decreased.

In an embodiment, due to retention degradation, the threshold voltage distribution of the first programmed state P1 may be decreased to a threshold voltage distribution of a 1'-st programmed state P1', the threshold voltage distribution of the second programmed state P2 may be decreased to a threshold voltage distribution of a 2'-nd programmed state P2', and the threshold voltage distribution of the third programmed state P3 may be decreased to a threshold voltage distribution of a 3'-rd programmed state P3'.

Also, the changes in the threshold voltage distributions may vary depending on the programmed states of the memory cells. For example, as the programmed states of the memory cells are higher, the changes in the threshold voltage distributions may further increase. That is, when the memory cells included in the memory device 100 are multi-level cells (MLC), the threshold voltages of the memory cells may increase in the direction from the first programmed state P1 to the third programmed state P3, and thus the potentials of the memory cells may also increase in proportion to the threshold voltages. Therefore, the change in the threshold voltage distribution of the third programmed state P3 may be the largest.

Based on this principle, even when the memory cells included in the memory device are managed in a triple-level cell (TLC) manner, a change in a threshold voltage distribution of a seventh programmed state P7, among first to seventh programmed states P1 to P7, may be the largest. Also, even when the memory cells included in the memory device are managed in a quadruple-level cell (QLC) manner, a change in a threshold voltage distribution of a fifteenth programmed state P15, among first to fifteenth programmed states P1 to P15, may be the largest.

When the threshold voltage distributions change due to retention degradation, data stored in the memory cells may be invalid, and thus, in the present embodiment, a read operation and a program operation for refreshing the data stored in the memory device 100 may be performed. The above-described read operation and program operation will be described below.

Figure 9:
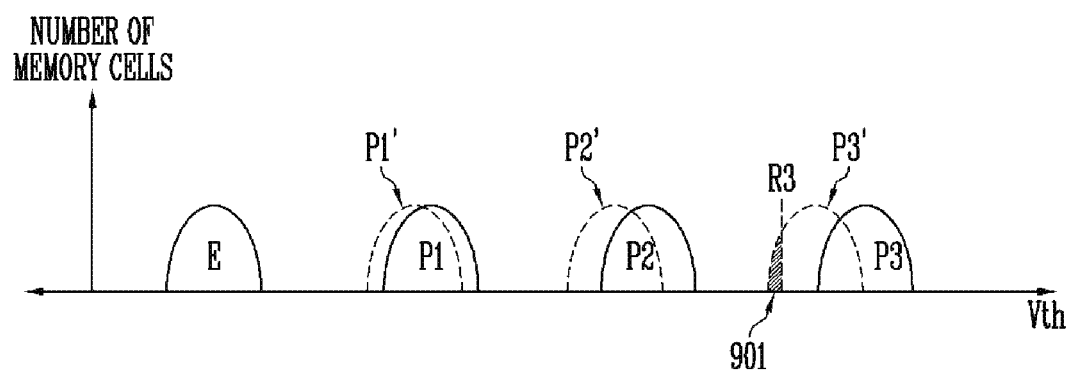
FIG. 9 is a diagram illustrating a method of counting the number of 1s during a read operation.

FIG. 9 is a diagram illustrating a method of counting the number of 1s during a read operation.

Referring to FIGS. 8 and 9, FIG. 9 illustrates a read operation performed to refresh data stored in memory cells in the threshold voltage distributions of FIG. 8.

In order to refresh the data stored in the memory device 100, the memory device 100 may perform a read operation using a third reference read voltage R3.

For example, when the memory device 100 performs a read operation, the memory cells may be turned on or turned off. When the memory cells are turned on, read data may be "1". In contrast, when the memory cells are turned off, read data may be "0". Therefore, the result of reading using any one of first to third reference read voltages R1 to R3 may be "0" or "1".

When a random program operation is performed, the numbers of memory cells included in different threshold voltage distributions are uniform. Thus, when the threshold voltage distributions of memory cells included in the memory device 100 have ideal distributions without changing, the number of memory cells that are turned on or off during a read operation may be the reference number of memory cells (i.e., a reference count). Therefore, the reference count may change according to the reference read voltage. In a case where the random program operation is performed, when the threshold voltage distributions of the memory cells included in the memory device 100 have ideal distributions, the number of memory cells that are turned on or off during the read operation may be preset, and thus the degree of retention degradation may be determined based on the preset number of memory cells. The word "preset" as used herein with respect to a parameter, such as a preset number of memory cells, preset reference value, preset reference count, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm. In an embodiment, the reference count may be set to a maximum number of memory cells predicted to be turned on or off when the selected memory cells are read using the reference read voltage.

In FIG. 9, since the threshold voltage distribution of the third programmed state P3 may change to the threshold voltage distribution of the 3'-rd programmed state P3' due to retention degradation, the number of memory cells that are actually turned on when the read operation is performed using the third reference read voltage R3 may be different from the preset reference number of memory cells (i.e., a preset reference count). Even in a case where the reference count is set based on the number of memory cells that are turned off, the number of memory cells that are actually turned off may be different from the preset reference count.

In an embodiment, when a shaded portion 901 in the threshold voltage distribution of the 3'-rd programmed state P3' may include memory cells that are turned on when the read operation is performed using the third reference read voltage R3. At this time, the number of memory cells that are turned on may be different from the reference count.

As a result, the threshold voltage distributions may change due to retention degradation, and memory cells that are to be turned off when they are read using the reference read voltage may be turned on.

Therefore, when the read operation is performed using the third reference read voltage R3, a number of memory cells different from the preset number of memory cells to be turned on or off may be turned on. The degree of retention degradation may be determined based on the difference between the preset number of memory cells to be turned on or turned off and the number of memory cells that are actually turned on or turned off.

In an embodiment, the memory device 100 may perform the read operation using the first or second reference read voltage R1 or R2. Based on the result of reading performed using the first or second reference read voltage R1 or R2, the degree of retention degradation may be determined.

FIG. 10 is a diagram for explaining a reference count and a read count.

Referring to FIGS. 7 to 10, a first column in FIG. 10 indicates a reference count REF_COUNT that is the preset number of memory cells to be turned on or turned off when the read operation is performed using a reference read voltage. A second column in FIG. 10 indicates a read count READ_COUNT that is the number of memory cells that are actually turned on or turned off when the read operation is performed using the reference read voltage. In the present disclosure, each of the reference count REF_COUNT and the read count READ_COUNT may be assumed to the number of turned-on memory cells.

A third column in FIG. 10 indicates the absolute value of the difference between the reference count REF_COUNT and the read count READ_COUNT. The degree of retention may be determined based on the absolute value of the difference between the reference count REF_COUNT and the read count READ_COUNT.

In an embodiment, when the memory cells included in the memory device 100 have ideal threshold voltage distributions, the preset number of memory cells to be turned on when the read operation is performed using the third reference read voltage R3 may be a third reference count REF_COUNT3. In an embodiment, the preset number of memory cells to be turned on when the read operation is performed using the first or second reference read voltage R1 or R2 may be a first or second reference count REF_COUNT1 or REF_COUNT2.

In an embodiment, depending on the degree of retention, the threshold voltage distribution of the third programmed state P3 may change in various forms. Therefore, depending on the threshold voltage distribution of the third programmed state P3, the number of memory cells that are actually turned on when the read operation is performed using the third reference read voltage R3 may be any of various values in addition to the first to fourth read counts READ_COUNT1 to 4 of FIG. 10.

Depending on the change in the threshold voltage distribution of memory cells in the third programmed state P3, the read count READ_COUNT calculated when the read operation is performed using the third reference read voltage R3 may be any one of the first to fourth read counts READ_COUNT1 to 4. Each of the first to fourth read counts READ_COUNT1 to 4 may have a value equal to or different from the reference count REF_COUNT.

In an embodiment, when the reference count REF_COUNT is equal to the read count READ_COUNT or when the absolute value of the difference between the reference count REF_COUNT and the read count READ_COUNT is less than or equal to a reference value corresponding to the third reference read voltage R3, the memory device 100 might not perform a refresh operation.

However, when the reference count REF_COUNT is different from the read count READ_COUNT and when the absolute value of the difference between the reference count REF_COUNT and the read count READ_COUNT is greater than the reference value, the memory device 100 may perform a refresh operation. That is, the absolute value of the difference between the reference count REF_COUNT and the read count READ_COUNT may be a criterion for performing a refresh operation.

In an embodiment, the refresh controller 150 may determine whether to shift the corresponding reference read voltage, based on the reference count REF_COUNT and the read count READ_COUNT.

For example, when the absolute value of the difference between the reference count REF_COUNT and the read count READ_COUNT is greater than the reference value, the memory device 100 may re-perform a read operation using a shifted read voltage SHIFT_RV. Based on the result of reading using the shifted read voltage SHIFT_RV, the memory device 100 may determine whether to perform a read operation by again shifting the shifted read voltage SHIFT_RV.

In an embodiment, after the read operation is performed using the shifted read voltage SHIFT_RV, the memory device 100 may set a step voltage depending on the absolute value of the difference between the reference count REF_COUNT and the read count READ_COUNT. The step voltage may be set based on the number of times that the read voltage is shifted, that is, SHIFTING_COUNT. When the memory device 100 sets the step voltage, the memory device 100 may perform a program operation using a voltage higher than a program voltage by the step voltage. That is, after the read operation has been performed using the shifted read voltage SHIFT_RV, when the absolute value of the difference between the reference count REF_COUNT and the read count READ_COUNT is less than or equal to the reference value, the memory device 100 may perform a program operation for refreshing the stored data.

FIG. 11 is a diagram for explaining reference read voltages and shifted read voltages depending on programmed states.

Referring to FIGS. 7 to 11, a first column in FIG. 11 indicates a programmed state P when memory cells included in the memory device 100 are multi-level cells (MLC). A second column in FIG. 11 indicates a reference read voltage R for distinguishing an erased state from a programmed state or distinguishing any one programmed state from another programmed state when threshold voltage distributions of memory cells included in the memory device 100 have ideal distributions. A third column in FIG. 11 indicates a shifted read voltage SHIFT_RV that is determined when the absolute value of the difference between the reference count REF_COUNT and the read count READ_COUNT of FIG. 10 is greater than a reference value.

In an embodiment, when the memory cells included in the memory device 100 are multi-level cells (MLC), each of the memory cells may have a state corresponding to any one of an erased state E and first to third programmed states P1 to P3. Also, when the memory cells included in the memory device 100 have ideal threshold voltage distributions, a read voltage for distinguishing the erased state E from the first programmed state P1 may be a first reference read voltage R1, a read voltage for distinguishing the first programmed state P1 from the second programmed state P2 may be a second reference read voltage R2, and a read voltage for distinguishing the second programmed state P2 from the third programmed state P3 may be a third reference read voltage R3.

Referring to FIG. 10, when the absolute value of the difference between the reference count REF_COUNT and the read count READ_COUNT is greater than the reference value, the memory device 100 may re-perform a read operation using a shifted read voltage SHIFT_RV. Although an example in which the number of shifted read voltages SHIFT_RV corresponding to respective programmed states is 3 is illustrated in FIG. 11, more shifted read voltages SHIFT_RV may be included.

In an embodiment, as a result of performing the read operation using the first reference read voltage R1, when the absolute value of the difference between the reference count REF_COUNT and the read count READ_COUNT is greater than the reference value corresponding to the first reference read voltage R1, the memory device 100 may perform a read operation using R1', which is the shifted read voltage SHIFT_RV. The shifted read voltage SHIFT_RV, that is, R1', may be lower than the first reference read voltage R1. That is, in order to measure the degree of retention, the memory device 100 may perform a read operation using a value lower than the first reference read voltage R1.

As a result of performing the read operation using the shifted read voltage SHIFT_RV, that is, R1', when the absolute value of the difference between the reference count REF_COUNT and the read count READ_COUNT is greater than the reference value corresponding to the first reference read voltage R1, the memory device 100 may perform a read operation using R1', which is lower than R1'.

As a result of performing the read operation using the shifted read voltage SHIFT_RV, that is, R1", when the absolute value of the difference between the reference count REF_COUNT and the read count READ_COUNT is greater than the reference value, the memory device 100 may perform a read operation using R1", which is lower than R1".

In an embodiment, when the read operation is performed using the shifted read voltage SHIFT_RV, obtained by shifting the first reference read voltage R1, and the absolute value of the difference between the reference count REF_COUNT and the read count READ_COUNT is less than or equal to the reference value, the memory device 100 may set a step voltage based on the number of times SHIFTING_COUNT that the first reference read voltage R1 is shifted. When the step voltage is set, the memory device 100 may perform a program operation using a voltage higher than a first program voltage Vpgm1 by the step voltage.

In an embodiment, as a result of performing the read operation using the second reference read voltage R2, when the absolute value of the difference between the reference count REF_COUNT and the read count READ_COUNT is greater than the reference value corresponding to the second reference read voltage R2, the memory device 100 may perform a read operation using R2', which is the shifted read voltage SHIFT_RV. The shifted read voltage SHIFT_RV, that is, R2', may be lower than the second reference read voltage R2. That is, in order to measure the degree of retention, the memory device 100 may perform a read operation using a value lower than the second reference read voltage R2.

As a result of performing the read operation using the shifted read voltage SHIFT_RV, that is, R2', when the absolute value of the difference between the reference count REF_COUNT and the read count READ_COUNT is greater than the reference value, the memory device 100 may perform a read operation using R2", which is lower than R2'. As a result of performing the read operation using the shifted read voltage SHIFT_RV, that is, R2", when the absolute value of the difference between the reference count REF_COUNT and the read count READ_COUNT is greater than the reference value, the memory device 100 may perform a read operation using R2", which is lower than R2".

In an embodiment, when the read operation is performed using the shifted read voltage SHIFT_RV, obtained by shifting the second reference read voltage R2, and the absolute value of the difference between the reference count REF_COUNT and the read count READ_COUNT is less than or equal to the reference value, the memory device 100 may set a step voltage based on the number of times SHIFTING_COUNT that the second reference read voltage R2 is shifted. When the step voltage is set, the memory device 100 may perform a program operation using a voltage higher than a second program voltage Vpgm2 by the step voltage.

In an embodiment, as a result of performing the read operation using the third reference read voltage R3, when the absolute value of the difference between the reference count REF_COUNT and the read count READ_COUNT is greater than the reference value corresponding to the third reference read voltage R3, the memory device 100 may perform a read operation using R3', which is the shifted read voltage SHIFT_RV. The shifted read voltage SHIFT_RV, that is, R3', may be lower than the third reference read voltage R3. That is, in order to measure the degree of retention, the memory device 100 may perform a read operation using a value lower than the third reference read voltage R3.

As a result of performing the read operation using the shifted read voltage SHIFT_RV, that is, R3', when the absolute value of the difference between the reference count REF_COUNT and the read count READ_COUNT is greater than the reference value, the memory device 100 may perform a read operation using R3", which is lower than R3'. As a result of performing the read operation using the shifted read voltage SHIFT_RV, that is, R3", when the absolute value of the difference between the reference count REF_COUNT and the read count READ_COUNT is greater than the reference value, the memory device 100 may perform a read operation using R3", which is lower than R3".

In an embodiment, when the read operation is performed using the shifted read voltage SHIFT_RV, obtained by shifting the third reference read voltage R3, and the absolute value of the difference between the reference count REF_COUNT and the read count READ_COUNT is less than or equal to the reference value, the memory device 100 may set a step voltage based on the number of times SHIFTING_COUNT that the third reference read voltage R3 is shifted. When the step voltage is set, the memory device 100 may perform a program operation using a voltage higher than a third program voltage Vpgm3 by the step voltage.

Figure 12:
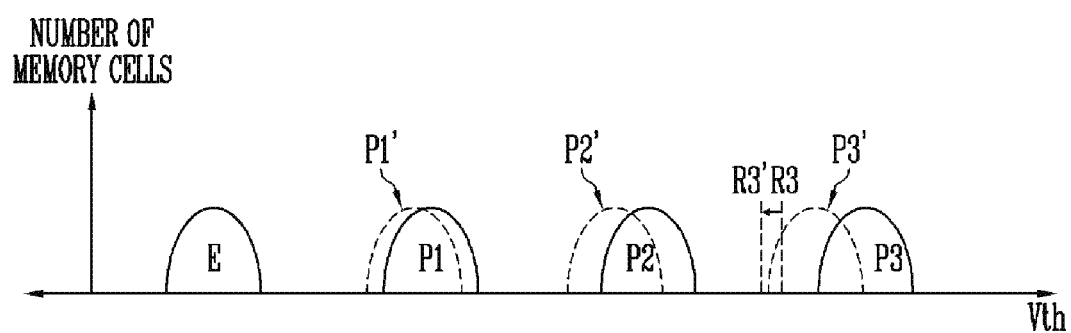
FIG. 12 is a diagram for explaining the number of reads counted (read count) when a read operation is performed using a shifted read voltage.

FIG. 12 is a diagram for explaining the number of reads (read count) counted when a read operation is performed using a shifted read voltage.

Referring to FIGS. 9 and 12, FIG. 12 illustrates a read operation performed when the absolute value of the difference between the reference count REF_COUNT and the read count READ_COUNT is greater than the reference value corresponding to the third reference read voltage R3, after the read operation has been performed using the third reference read voltage R3 in FIG. 9.

For example, in FIG. 9, when the read operation is performed using the third reference read voltage R3, memory cells in the shaded portion 901 are turned on, and thus more memory cells than memory cells corresponding to the reference count REF_COUNT may be turned on. Therefore, the read count READ_COUNT may be greater than the reference count REF_COUNT. The read count READ_COUNT may be greater than the reference count REF_COUNT, and then the absolute value of the difference between the reference count REF_COUNT and the read count READ_COUNT may be greater than the reference value.

Since the absolute value of the difference between the reference count REF_COUNT and the read count READ_COUNT is greater than the reference value, the memory device 100 may re-perform a read operation using the shifted read voltage SHIFT_RV. In this case, the memory device 100 may perform a read operation using R3', which is a read voltage shifted from the third reference read voltage R3.

When the read operation is performed using R3', which is the shifted read voltage SHIFT_RV, the absolute value of the difference between the reference count REF_COUNT and the read count READ_COUNT may fall within the range of the reference value. In this case, the third reference read voltage R3 may be shifted once. Based on the number of times that the third reference read voltage R3 is shifted, the step voltage of the program operation to be subsequently performed may be set.

In an embodiment, when the read operation is performed using R3' which is the shifted read voltage SHIFT_RV, the absolute value of the difference between the reference count REF_COUNT and the read count READ_COUNT may be greater than the reference value corresponding to the third reference read voltage R3.

Since the absolute value of the difference between the reference count REF_COUNT and the read count READ_COUNT is greater than the reference value, the read operation may be performed using R3", which is the read voltage SHIFT_RV shifted from R3'. When the read operation is performed using R3", which is the shifted read voltage SHIFT_RV, the absolute value of the difference between the reference count REF_COUNT and the read count READ_COUNT may fall within the range of the reference value. In this case, the third reference read voltage R3 has been shifted twice. Based on the number of times that the third reference read voltage R3 is shifted, the step voltage of the program operation to be subsequently performed may be set.

FIG. 13 is a diagram for explaining step voltages that are set according to the shifting count.

Referring to FIG. 13, a first column in FIG. 13 indicates a shifting count SHIFTING_COUNT that is the number of times that a reference read voltage is shifted. A second column in FIG. 13 indicates a step voltage corresponding to each shifting count SHIFTING_COUNT. That is, when the shifting count SHIFTING_COUNT is 1, the step voltage Vstep may be a first step voltage Vstep1, when the shifting count SHIFTING_COUNT is 2, the step voltage Vstep may be a second step voltage Vstep2, when the shifting count SHIFTING_COUNT is 3, the step voltage may be a third step voltage Vstep3, and when the shifting count SHIFTING_COUNT is 4, the step voltage Vstep may be a fourth step voltage Vstep4.

In an embodiment, the first to third reference read voltages R1 to R3 may be shifted. For example, during the read operation, when the reference count REF_COUNT, which is the number of memory cells to be turned on when the memory cells included in the memory device 100 have ideal threshold voltage distributions, is different from the read count READ_COUNT, which is the number of memory cells turned on when the read operation is performed using an actual reference read voltage, the first to third reference read voltages R1 to R3 may be shifted. The first to third reference read voltages R1 to R3 may be shifted until the absolute value of the difference between the reference count REF_COUNT and the read count READ_COUNT becomes less than or equal to the reference value corresponding to each of the first to third reference read voltages R1 to R3.

Although, in FIG. 13, the shifting count SHIFTING_COUNT is illustrated as being 1 to 4, the first to third reference read voltages R1 to R3 may be shifted a larger number of times.

In an embodiment, when the corresponding reference read voltage is shifted once, the step voltage Vstep may be set to the first step voltage Vstep1. When the corresponding reference read voltage is shifted twice, the step voltage Vstep may be set to the second step voltage Vstep2. When the corresponding reference read voltage is shifted three times, the step voltage Vstep may be set to the third step voltage Vstep3. When the corresponding reference read voltage is shifted four times, the step voltage Vstep may be set to the fourth step voltage Vstep4.

In an embodiment, the magnitude of the step voltage Vstep may vary depending on the programmed states of the memory cells. For example, as the programmed state of memory cells is higher, retention degradation may increase, and thus the level of the step voltage Vstep may increase in a direction from a low programmed state to a high programmed state. That is, although the shifting count SHIFTING_COUNT, which is the number of times that the read voltage is shifted during the read operation, is identical, the step voltage Vstep in a high programmed state may be higher than the step voltage Vstep in a low programmed state.

When the step voltage Vstep is set, the memory device 100 may apply a voltage higher than the program voltage, applied to a selected word line, by the step voltage Vstep to the selected word line to program the memory cells to each programmed state. That is, in order to refresh the data stored in the memory cells, the memory device 100 may apply the voltage higher than the program voltage by the step voltage Vstep to the selected word line.

In an embodiment, during the read operation, an increase in the shifting count SHIFTING_COUNT may mean that a change in a threshold voltage distribution is large. That is, when the change in the threshold voltage distribution is large due to retention, the number of times that the reference read voltage is shifted, that is, the shifting count SHIFTING_COUNT, may increase. The case where the number of times that the reference read voltage is shifted becomes larger may mean that the change in the threshold voltage distribution is larger, and thus the step voltage Vstep for refreshing the data stored in the memory device 100 may further increase. Consequently, in FIG. 13, the level of the voltage may increase in a direction from the first step voltage Vstep1 to the fourth step voltage Vstep4.

When the step voltage Vstep is set, the memory device 100 may perform a program operation based on the set step voltage Vstep. The program operation performed by the memory device 100 will be described below.

Figure 14:
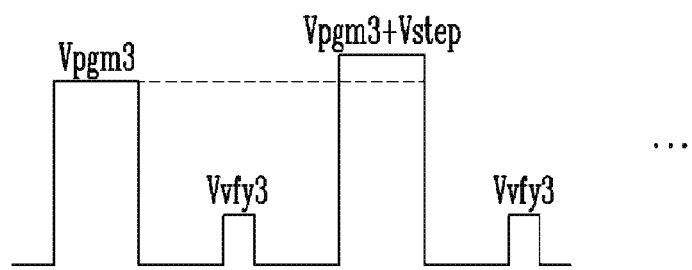
FIG. 14 is a diagram for explaining a program operation and a verify operation included in a program loop.

FIG. 14 is a diagram for explaining a program operation and a verify operation included in a program loop.

Referring to FIG. 14, FIG. 14 illustrates some of program loops executed to increase threshold voltages of memory cells programmed to a third programmed state P3, among memory cells coupled to a selected word line. Each of the program loops may include a program operation and a verify operation. The program operation may be an operation of applying a program voltage to a selected word line, which is a word line to which selected memory cells are coupled. The verify operation may be an operation of applying a verify voltage to the selected word line.

In an embodiment, a third program voltage Vpgm3 may be applied to the selected word line so as to program the memory cells coupled to the selected word line to the third programmed state P3, after which a third verify voltage Vvf3 may be applied to the selected word line to verify the programmed states of the plurality of memory cells.

The memory cells which have passed the verify operation (i.e., verify pass) through the third verify voltage Vvfy3 may be determined to have a target programmed state.

During the verify operation, the verify voltage may be applied to the selected word line, and a memory device may determine whether memory cells have passed the verify operation based on currents or voltages flowing through bit lines coupled to the selected memory cells, respectively.

Memory cells, the threshold voltages of which cannot reach the target programmed state, may fail in the verify operation (i.e., verify fail). A next program loop may be executed on the verify-failed memory cells.

In order to program verify-failed memory cells in the next program loop, the program voltage higher than the third program voltage Vpgm3 by a step voltage Vstep may be applied to the selected word line. Thereafter, the verify operation may be performed. As a result of performing the verify operation, a next program loop may be executed on the verify-failed memory cells.

Since the above-described reprogram operation is performed to increase the threshold voltages of previously programmed memory cells, the threshold voltages may reach the target programmed state using only one program operation and one verify operation.

Figure 15:
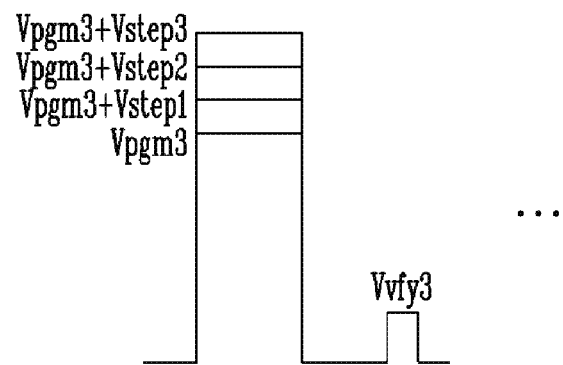
FIG. 15 is a diagram for explaining a program operation and a verify operation included in a program loop during a refresh operation.

FIG. 15 is a diagram for explaining a program operation and a verify operation included in a program loop during a refresh operation.

Referring to FIGS. 9 to 15, FIG. 15 illustrates a state after a read operation for refreshing memory cells is performed when the memory cells are operated in a multi-level cell (MLC) manner, and a read operation is performed using a shifted read voltage SHIFT_RV based on the result of performing the read operation. That is, FIG. 15 illustrates a state after a process in which memory cells in a third programmed state P3 are read using a third reference read voltage R3, and in which the absolute value of the difference between a reference count REF_COUNT and a read count READ_COUNT is greater than a reference value corresponding to the third reference read voltage R3, and then the memory cells are read using the shifted read voltage SHIFT_RV, after which the absolute value of the difference between the reference count REF_COUNT and the read count READ_COUNT becomes less than or equal to the reference value corresponding to the third reference read voltage R3.

Based on the number of times that the third reference read voltage R3 is shifted, that is, the shifting count SHIFTING_COUNT, the step voltage may be set. In FIG. 15, the step voltage is assumed to be any one of first to third step voltages Vstep1 to 3. That is, the shifting count SHIFTING_COUNT of the third reference read voltage R3 is assumed to be any one of 1 to 3.

In an embodiment, when the shifting count SHIFTING_COUNT of the third reference read voltage R3 is 1, the step voltage may be set to the first step voltage Vstep1. Therefore, a voltage higher than the third program voltage Vpgm3 by the first step voltage Vstep1 may be applied to the selected word line to which the selected memory cells are coupled. After the voltage higher than the third program voltage Vpgm3 by the first step voltage Vstep1 has been applied, the verify operation may be performed.

When the verify operation has failed as a result of performing the verify operation, a voltage increased by the step voltage from the voltage, which is higher than the third program voltage Vpgm3 by the first step voltage Vstep1, may be applied to the selected word line. Thereafter, the verify operation may be performed.

In an embodiment, when the shifting count SHIFTING_COUNT of the third reference read voltage R3 is 2, the step voltage may be set to the second step voltage Vstep2. Therefore, a voltage higher than the third program voltage Vpgm3 by the second step voltage Vstep2 may be applied to the selected word line to which the selected memory cells are coupled. After the voltage higher than the third program voltage Vpgm3 by the second step voltage Vstep2 has been applied, the verify operation may be performed.

When the verify operation has failed as a result of performing the verify operation, a voltage increased by the step voltage from the voltage, which is higher than the third program voltage Vpgm3 by the second step voltage Vstep2, may be applied to the selected word line. Thereafter, the verify operation may be performed.

In an embodiment, when the shifting count SHIFTING_COUNT of the third reference read voltage R3 is 3, the step voltage may be set to the third step voltage Vstep3. Therefore, a voltage higher than the third program voltage Vpgm3 by the third step voltage Vstep3 may be applied to the selected word line to which the selected memory cells are coupled. After the voltage higher than the third program voltage Vpgm3 by the third step voltage Vstep3 has been applied, the verify operation may be performed.

When the verify operation has failed as a result of performing the verify operation, a voltage increased by the step voltage from the voltage, which is higher than the third program voltage Vpgm3 by the third step voltage Vstep3, may be applied to the selected word line. Thereafter, the verify operation may be performed.

Consequently, in order to refresh data stored in the memory device 100, data might not be output to the memory controller 200. That is, after the data stored in the memory device 100 has been read and the degree of retention has been determined, a step voltage may be set depending on the degree of retention, and the memory cells may then be reprogrammed. Therefore, the data stored in the memory device 100 may be refreshed without being output to the memory controller 200.

Figure 16:
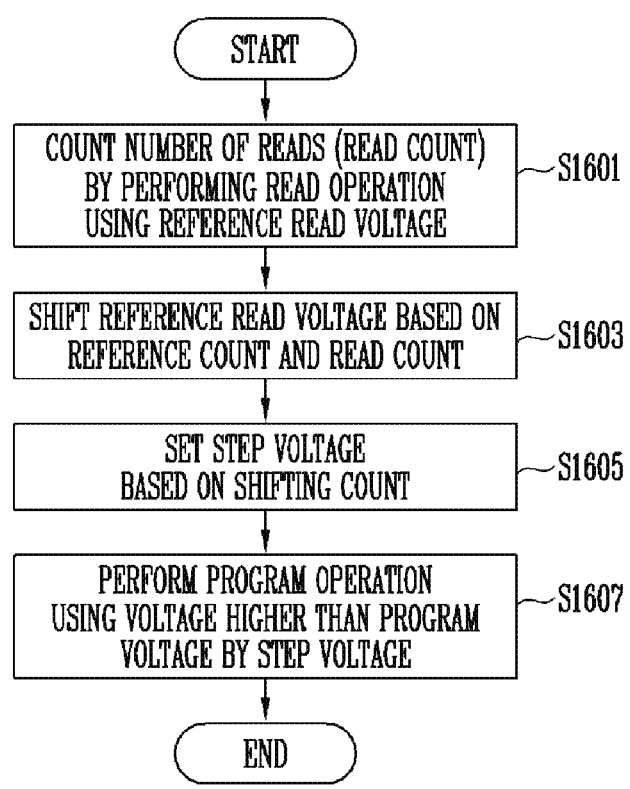
FIG. 16 is a flowchart illustrating the operation of a memory device according to an embodiment of the present disclosure.

FIG. 16 is a flowchart illustrating the operation of a memory device according to an embodiment of the present disclosure.

Referring to FIG. 16, at step S1601, the memory device 100 may read a selected word line to which selected memory cells are coupled using a reference read voltage, and may then count the number of reads (i.e., read count READ_COUNT). The reference read voltage may be a voltage for distinguishing a programmed state from an erased state E or for distinguishing one programmed state from another programmed state when the memory cells have ideal threshold voltage distributions. Further, the read count READ_COUNT may be the number of memory cells that are turned on when a read operation is performed using the reference read voltage. That is, the read count READ_COUNT may be the number of memory cells read as "1" when the memory cells are read using the reference read voltage.

At step S1603, the memory device 100 may shift the reference read voltage based on a reference count REF_COUNT and the read count READ_COUNT. The reference count REF_COUNT may be the number of memory cells to be turned on during a read operation using the reference read voltage when the memory cells have ideal threshold voltage distributions. The reference count REF_COUNT may be determined in advance.

For example, when the absolute value of the difference between the reference count REF_COUNT and the read count READ_COUNT is greater than a reference value corresponding to the reference read voltage, the reference read voltage may be shifted. In contrast, when the absolute value of the difference between the reference count REF_COUNT and the read count READ_COUNT is less than or equal to the reference value, the reference read voltage might not be shifted. When the absolute value of the difference between the reference count REF_COUNT and the read count READ_COUNT is greater than the reference value, the reference read voltage may be shifted at least once.

At step S1605, the memory device 100 may determine a step voltage based on a shifting count SHIFTING_COUNT. The shifting count SHIFTING_COUNT may refer to the number of times that the reference read voltage is shifted. As the number of times that the reference read voltage is shifted (i.e., the shifting count) increases, the level of the step voltage may also increase.

At step S1607, the memory device 100 may perform a program operation using a voltage higher than a program voltage by the step voltage.

For example, when data to be refreshed is in a first program state P1, the memory device 100 may apply a voltage higher than a first program voltage Vpgm1 by the step voltage to the selected word line. When data to be refreshed is in a second programmed state P2, the memory device 100 may apply a voltage higher than a second program voltage Vpgm2 by the step voltage to the selected word line. When data to be refreshed is in a third programmed state P3, the memory device 100 may apply a voltage higher than a third program voltage Vpgm3 by the step voltage to the selected word line. After the voltage higher than the corresponding program voltage by the step voltage has been applied to the selected word line, the verify operation may be performed.

Figure 17:
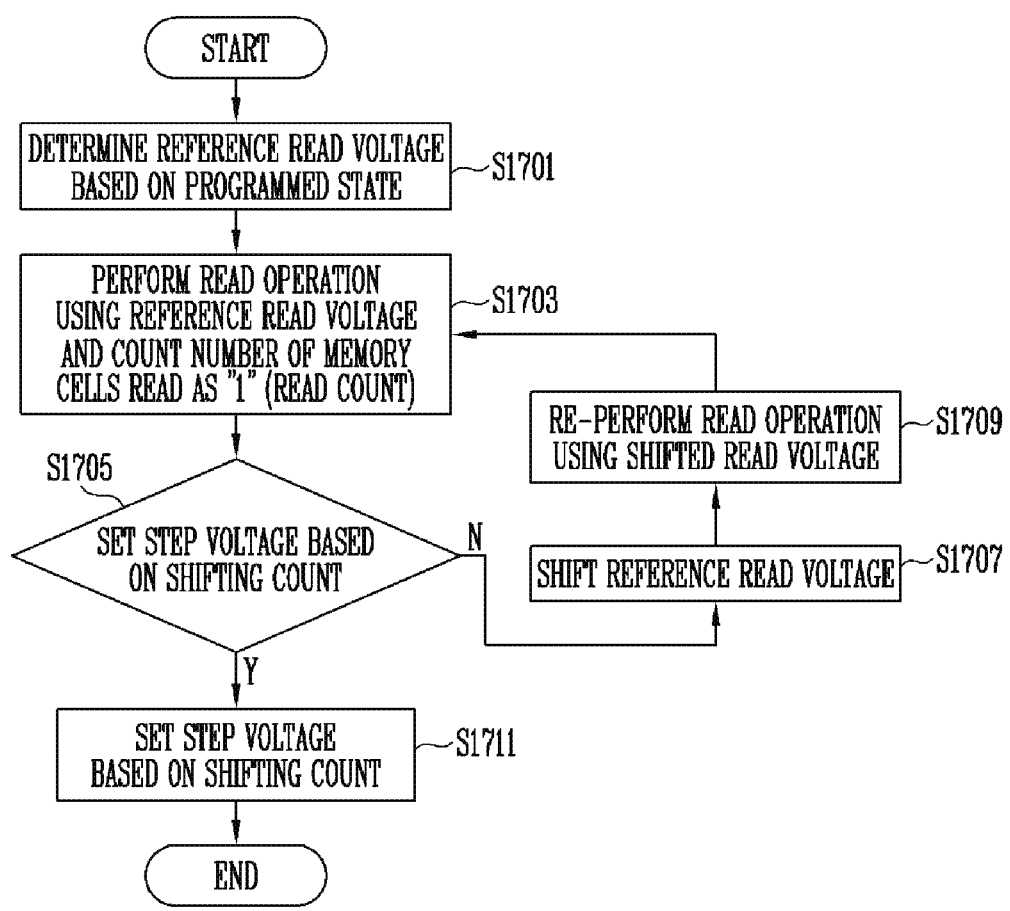
FIG. 17 is a flowchart illustrating the operation of a memory device according to an embodiment of the present disclosure.

FIG. 17 is a flowchart illustrating the operation of a memory device according to an embodiment of the present disclosure.

Referring to FIGS. 16 and 17, steps S1701 and S1703 may be steps obtained by subdividing step S1601, and steps S1703 to S1709 may be steps obtained by subdividing step S1603. Step S1711 may be identical to step S1605.

At step S1701, the memory device 100 may determine a reference read voltage based on a programmed state. That is, the reference read voltage may be determined depending on the programmed state of data to be refreshed.

Referring to FIG. 7, when data to be refreshed is programmed to the first programmed state P1, the memory device 100 may perform a read operation using the first reference read voltage R1. When the memory cells to be refreshed are programmed to the second programmed state P2, the memory device 100 may read memory cells using the second reference read voltage R2. When the memory cells to be refreshed are programmed to the third programmed state P3, the memory device 100 may read the memory cells using the third reference read voltage R3.

At step S1703, the memory device 100 may read the memory cells using the reference read voltage, and may count the number of memory cells read as "1", that is, READ_COUNT. That is, the memory device 100 may read the memory cells using the reference read voltage, and then count the number of memory cells that are turned on. The reference read voltage may be any one of the first to third reference read voltages R1 to R3.

At step S1705, the memory device 100 may set a step voltage by determining whether the absolute value of the difference between the reference count REF_COUNT and the read count READ_COUNT is less than or equal to the reference value. The reference count REF_COUNT may be the number of memory cells that are turned on during the read operation using the reference read voltage when the threshold voltage distributions of the memory cells indicate ideal threshold voltage distributions. The reference value may be a value corresponding to the reference read voltage, and may be preset. As a result, the memory device 100 may determine whether the absolute value of the difference between the number of memory cells that can be read when the threshold voltage distributions of the memory cells are ideal and the number of memory cells that are actually read is greater than the preset reference value.

When the absolute value of the difference between the reference count REF_COUNT and the read count READ_COUNT is less than or equal to the reference value (in case of 'Y'), the step voltage may be set based on the shifting count at step S1711. When the absolute value of the difference between the reference count REF_COUNT and the read count READ_COUNT is not less than or equal to the reference value (in case of 'N'), that is, when the absolute value of the difference between the reference count REF_COUNT and the read count READ_COUNT is greater than the reference value, step S1707 may be performed.

At step S1707, the memory device 100 may shift the reference read voltage. That is, when the change in the corresponding threshold voltage distribution is large due to retention, the memory device 100 may shift the reference read voltage. The memory device 100 may shift the reference read voltage until the absolute value of the difference between the reference count REF_COUNT and the read count READ_COUNT becomes less than or equal to the reference value.

In an embodiment, since the threshold voltage distributions of memory cells are decreased due to retention degradation, the shifted read voltage SHIFT_RV may have a level lower than the reference read voltage. That is, until the absolute value of the difference between the reference count REF_COUNT and the read count READ_COUNT becomes less than or equal to the reference value, the reference read voltage may be gradually shifted to a lower level.

When the reference read voltage is shifted at step S1707, the memory device 100 may re-perform a read operation using the shifted read voltage SHIFT_RV at step S1709. Then, steps S1703 to S1709 may be repeated until the absolute value of the difference between the reference count REF_COUNT and the read count READ_COUNT becomes less than or equal to the reference value at step S1705 (in case of 'Y').

When the absolute value of the difference between the reference count REF_COUNT and the read count READ_COUNT becomes less than or equal to the reference value (in case of 'Y') at step S1705, the step voltage may be set based on the shifting count SHIFTING_COUNT at step S1711. The shifting count SHIFTING_COUNT may denote the number of times that the reference read voltage is shifted.

In an embodiment, during the read operation, an increase in the shifting count SHIFTING_COUNT may mean that a change in a threshold voltage distribution is large. That is, when the change in the threshold voltage distribution is large due to retention, the number of times that the reference read voltage is shifted, that is, the shifting count SHIFTING_COUNT, may increase. As the shifting count SHIFTING_COUNT increases, the level of the step voltage may also increase.

Figure 18:
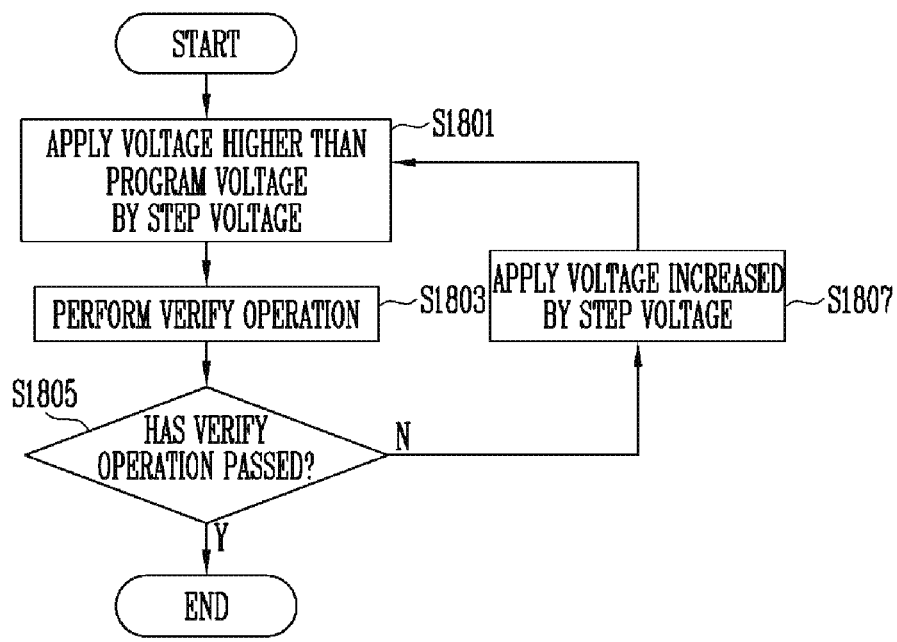
FIG. 18 is a flowchart illustrating the operation of a memory device according to an embodiment of the present disclosure.

FIG. 18 is a flowchart illustrating the operation of a memory device according to an embodiment of the present disclosure.

Referring to FIG. 18, at step S1801, the memory device 100 may apply a voltage higher than a program voltage by a step voltage to a selected word line. The step voltage may be set based on the number of times that a reference read voltage is shifted, that is, SHIFTING_COUNT. The operation of applying a voltage higher than the program voltage by the step voltage to the selected word line may be a program operation in one program loop.

In an embodiment, when the selected memory cells coupled to the selected word line are programmed to a first programmed state P1, the memory device 100 may apply a voltage higher than a first program voltage Vpgm1 by the step voltage to the selected word line. In an embodiment, when the selected memory cells coupled to the selected word line are programmed to a second programmed state P2, the memory device 100 may apply a voltage higher than a second program voltage Vpgm2 by the step voltage to the selected word line. Also, when the selected memory cells coupled to the selected word line are programmed to a third programmed state P3, the memory device 100 may apply a voltage higher than a third program voltage Vpgm3 by the step voltage to the selected word line.

At step S1803, the memory device 100 may perform a verify operation. The verify operation may be an operation performed after the program operation has been performed in one program loop. The memory device 100 may determine whether the threshold voltages of the selected memory cells have reached a target programmed state through the verify operation.

At step S1805, the memory device 100 may determine whether the memory cells have passed the verify operation. When the selected memory cells have passed the verify operation (in case of 'Y'), the refresh operation on the data stored in the selected memory cells is terminated. When the selected memory cells do not pass the verify operation (in case of 'N'), step S1807 is performed.

At step S1807, the memory device 100 may apply a voltage higher than the program voltage by the step voltage to the selected word line. Then, until the verify operation passes (in case of 'Y'), step S1807 may be repeated.

Figure 19:
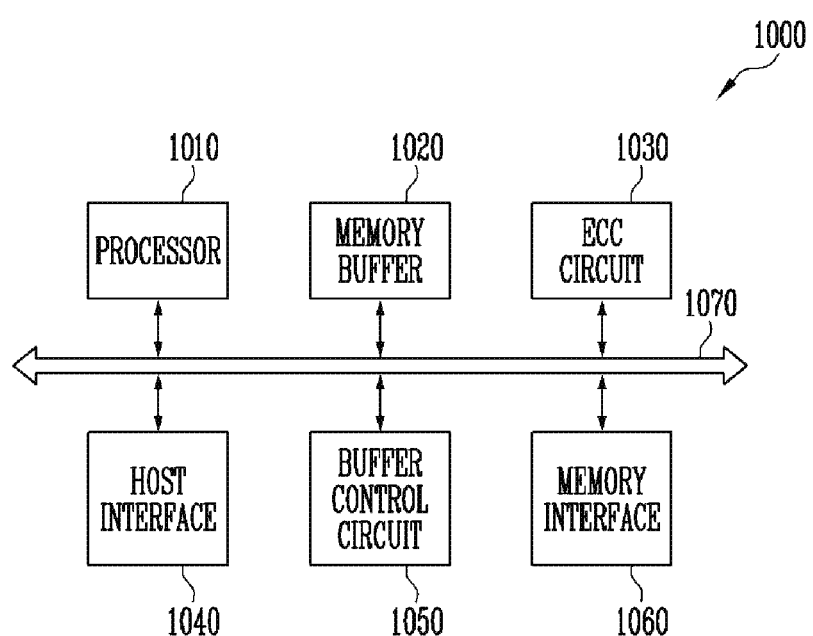
FIG. 19 is a diagram illustrating an embodiment of a memory controller of FIG. 1.

FIG. 19 is a diagram illustrating an embodiment of the memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 19, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

The processor 1010 may convert a request received from the host into a command usable in the memory system, and may output the command. For example, when a refresh request is received from the host, the processor 1010 may convert the refresh request into a refresh command, and may output the refresh command to the memory device through the memory interface 1060. Alternatively, even if the refresh request is not received from the host, the processor 1010 may output the refresh command at preset intervals during the background operation.

The processor 1010 may run software or firmware to perform the randomizing or derandomizing operation.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
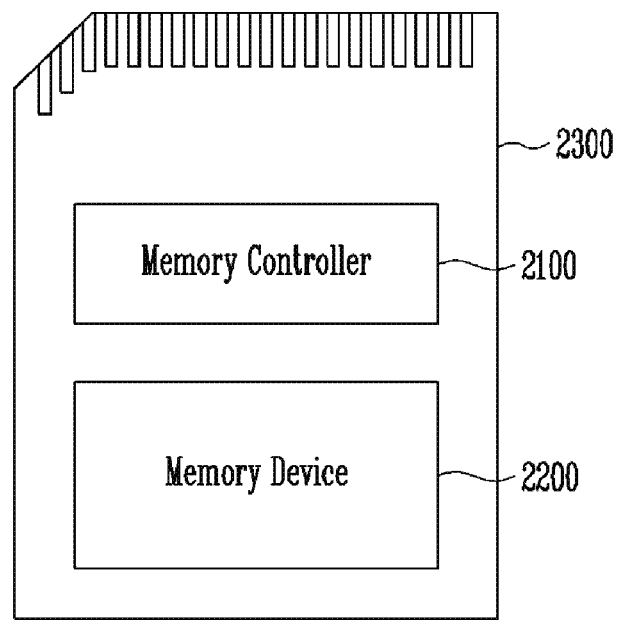
FIG. 20 is a block diagram illustrating a memory card system to which a storage device according to an embodiment of the present disclosure is applied.

FIG. 20 is a block diagram illustrating a memory card system to which the storage device according to an embodiment of the present disclosure is applied.

Referring to FIG. 20, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device 100 described above with reference to FIG. 2.

The processor 2100 may convert a request received from the host into a command usable in the memory card system 2000, and may output the command. For example, when a refresh request is received from the host, the memory controller 2100 may convert the refresh request into a refresh command, and may output the refresh command to the memory device 2200. Alternatively, even if the refresh request is not received from the host, the memory controller 2100 may output the refresh command at preset intervals during the background operation.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-M RAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 21:
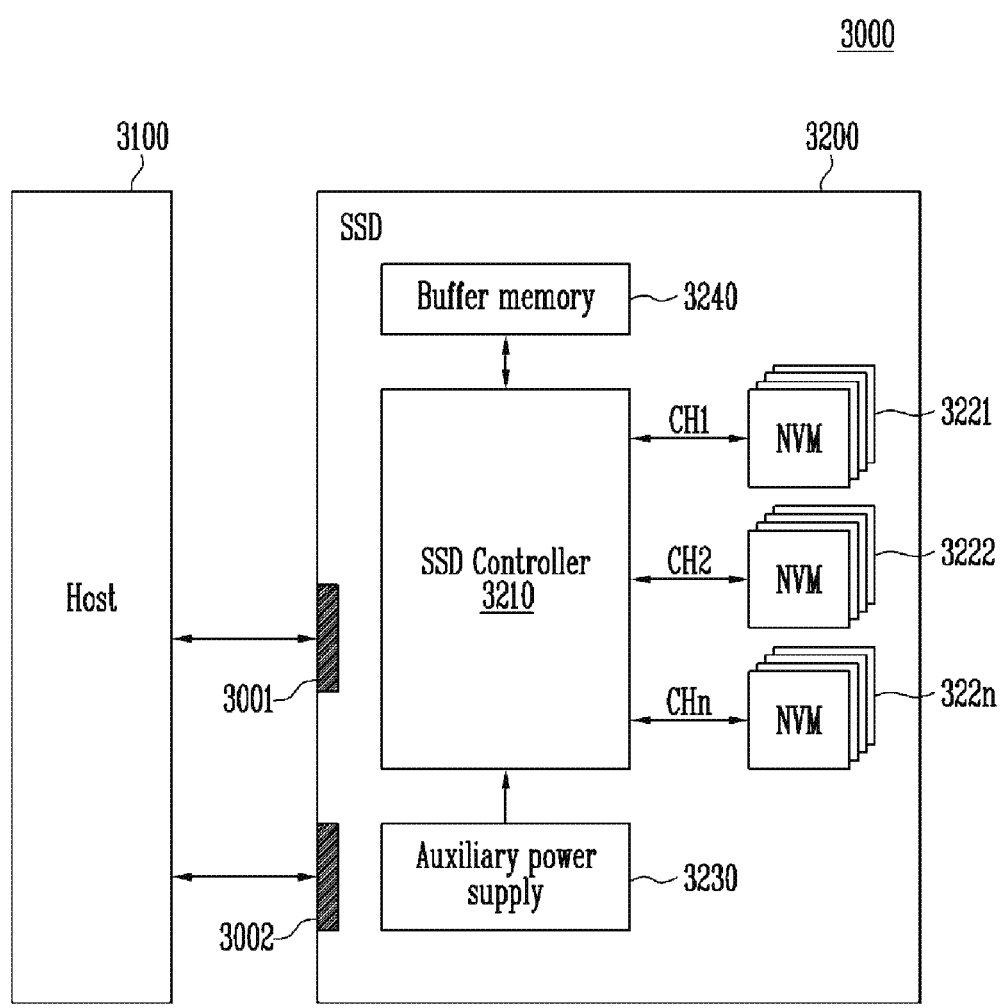
FIG. 21 is a block diagram illustrating an example of a solid state drive (SSD) system to which a storage device according to an embodiment of the present disclosure is applied.

FIG. 21 is a block diagram illustrating an example of a solid state drive (SSD) system to which the storage device according to an embodiment of the present disclosure is applied.

Referring to FIG. 21, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The SSD controller 3210 may convert a request received from the host 3100 into a command usable in the SSD system 3000, and may output the command. For example, when a refresh request is received from the host 3100, the SSD controller 3210 may convert the refresh request into a refresh command, and may output the refresh command to the flash memories 3221 to 322n. Alternatively, even if the refresh request is not received from the host 3100, the SSD controller 3210 may output the refresh command at preset intervals during the background operation.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
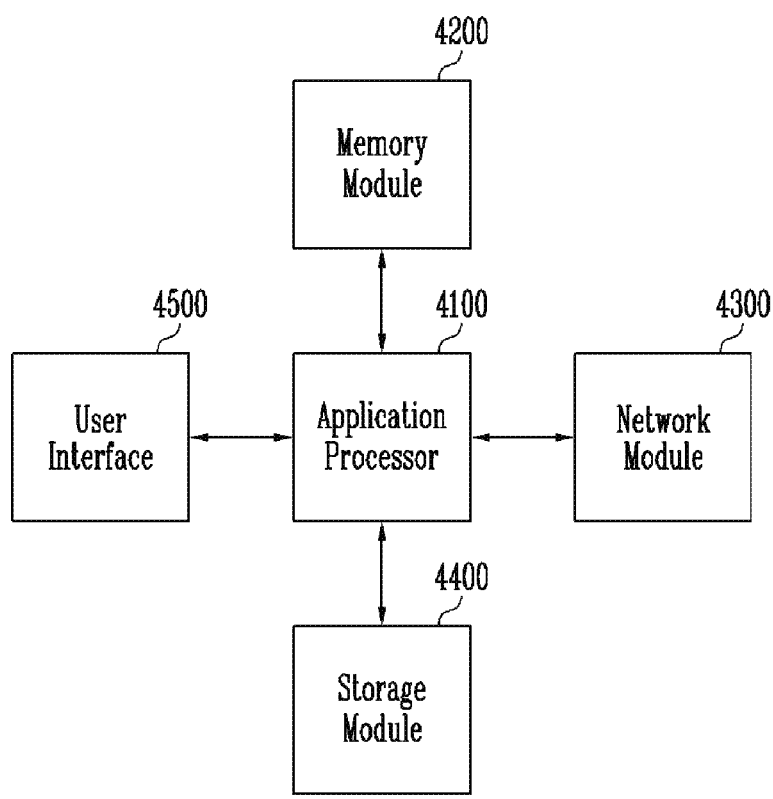
FIG. 22 is a block diagram illustrating a user system to which a storage device according to an embodiment of the present disclosure is applied.

FIG. 22 is a block diagram illustrating a user system to which the storage device according to an embodiment of the present disclosure is applied.

Referring to FIG. 22, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The application processor 4100 may convert a request received from the host into a command usable in the user system 4000, and may output the command. For example, when a refresh request is received from the host, the application processor 4100 may convert the refresh request into a refresh command, and may output the refresh command to the user system 4000. Alternatively, even if the refresh request is not received from the host, the application processor 4100 may output the refresh command at preset intervals during the background operation.

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2, 4 to 6. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a memory device, which refreshes data without outputting the data to a memory controller, and a method of operating the memory device.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment might not always be sequentially performed in given order, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the concepts described herein will still fall within the spirit and scope of the present disclosure as defined in the appended claims and their equivalents.

What is claimed is:

1. A memory device, comprising:
a plurality of memory cells configured to store data;
a peripheral circuit configured to perform a program operation and a read operation on memory cells selected from among the plurality of memory cells; and
a refresh controller configured to include a counter and a refresh manager,
wherein the counter is configured to count a number of memory cells which are in an erased state or a programmed state by performing a read operation on the selected memory cells using a reference read voltage determined depending on a programmed state of the selected memory cells; and the refresh manager is configured to compare a read count indicating the counted number of memory cells, with a preset reference count, to determine whether to shift the reference read voltage based on a result of the comparison, and to control the peripheral circuit so that the program operation is performed using a voltage higher than a program voltage used to program the selected memory cells by a step voltage that is set based on a shifting count indicating a number of times that the reference read voltage is shifted.

2. The memory device according to claim 1, wherein the reference read voltage is set between a threshold voltage distribution of a selected programmed state and a threshold voltage distribution lower than the threshold voltage distribution of the selected programmed state, among threshold voltage distributions of the selected memory cells.

3. The memory device according to claim 1, wherein the reference count is set to a maximum number of memory cells predicted to be turned on when the selected memory cells are read using the reference read voltage.

4. The memory device according to claim 1, wherein the refresh manager is configured to, when an absolute value of a difference between the reference count and the read count is greater than a preset reference value, control the peripheral circuit so that the reference read voltage is shifted.

5. The memory device according to claim 4, wherein the refresh manager is configured to determine whether an absolute value of a difference between the reference count and a read count is greater than the reference value, wherein the read count is obtained by counting a number of memory cells that are turned on by performing a read operation on the selected memory cells using a shifted read voltage that is obtained by shifting the reference read voltage.

6. The memory device according to claim 4, wherein the refresh manager is configured to control the peripheral circuit so that the shifted read voltage is lower than the reference read voltage.

7. The memory device according to claim 1, wherein the refresh manager is configured to, when an absolute value of a difference between the reference count and the read count is equal to or less than a preset reference value, set the step voltage based on the shifting count.

8. The memory device according to claim 1, wherein the refresh manager is configured to, as the shifting count increases, set the step voltage to a higher voltage.

9. The memory device according to claim 1, wherein the refresh manager is configured to control the peripheral circuit so that the program operation is performed by applying the program voltage to a selected word line to which the selected memory cells are coupled.

10. The memory device according to claim 9,
wherein the peripheral circuit is configured to perform a verify operation on the memory cells selected from among the plurality of memory cells; and
wherein the refresh manager is configured to control the peripheral circuit so that the verify operation is performed after the program operation has been performed.

11. The memory device according to claim 10, wherein the refresh manager is configured to, when the verify operation fails, perform the program operation by applying a voltage higher than the program voltage by the step voltage to the selected word line.

12. A method of operating a memory device including a plurality of memory cells in which data is stored, the method comprising:
performing a read operation on memory cells, selected from among the plurality of memory cells, using a reference read voltage determined depending on a programmed state of the selected memory cells;
counting a number of memory cells that are turned on through the read operation to obtain a read count;
determining whether to shift the reference read voltage by comparing the read count with a preset reference count;
setting a step voltage based on a shifting count indicating a number of times that the reference read voltage is shifted; and
performing a program operation using a voltage higher than a program voltage used to program the selected memory cells by the step voltage.

13. The method according to claim 12, wherein performing the read operation using the reference read voltage is configured to set the reference read voltage between a threshold voltage distribution of a selected programmed state and a threshold voltage distribution lower than the threshold voltage distribution of the selected programmed state, among threshold voltage distributions of the selected memory cells.

14. The method according to claim 12, wherein determining whether to shift the reference read voltage is configured to, when an absolute value of a difference between the reference count and the read count is greater than a preset reference value, shift the reference read voltage.

15. The method according to claim 14, further comprising:
determining whether an absolute value of a difference between the reference count and a read count is greater than the reference value, wherein the read count is obtained by counting a number of memory cells that are turned on by performing a read operation on the selected memory cells using a shifted read voltage that is obtained by shifting the reference read voltage.

16. The method according to claim 14, wherein determining whether to shift the reference read voltage is configured to allow the shifted read voltage to be lower than the reference read voltage.

17. The method according to claim 12, wherein setting the step voltage is configured to, when an absolute value of a difference between the reference count and the read count is less than or equal to a preset reference value, set the step voltage based on the shifting count.

18. The method according to claim 12, wherein setting the step voltage is configured to, as the shifting count increases, set the step voltage to a higher voltage.

19. The method according to claim 12, wherein performing the program operation is configured to apply the program voltage to a selected word line to which the selected memory cells are coupled.

20. The method according to claim 19, further comprising performing a verify operation after the program operation has been performed.

* * * * *